United States Patent
Ahrens et al.

(10) Patent No.: US 7,030,457 B2
(45) Date of Patent: Apr. 18, 2006

(54) CAPACITOR AND METHOD FOR PRODUCING A CAPACITOR

(75) Inventors: Carsten Ahrens, München (DE); Angelika Geiselbrechtinger, Grasbrunn (DE); Wolfgang Hartung, München (DE); Christian Herzum, Pöcking (DE); Reinhard Losehand, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/853,740

(22) Filed: May 25, 2004

(65) Prior Publication Data

US 2005/0013090 A1    Jan. 20, 2005

Related U.S. Application Data

(63) Continuation of application No. PCT/EP02/12786, filed on Nov. 14, 2002.

(30) Foreign Application Priority Data

Nov. 30, 2001   (DE) ................................ 101 58 798

(51) Int. Cl.
    *H01L 29/00*   (2006.01)

(52) U.S. Cl. ....................... 257/516; 257/301

(58) Field of Classification Search ................ 257/301, 257/516
See application file for complete search history.

(56) References Cited

U.S. PATENT DOCUMENTS

| 4,017,885 | A | * | 4/1977 | Kendall et al. ............. 257/534 |
| 5,291,438 | A | * | 3/1994 | Witek et al. ................ 365/149 |
| 5,770,484 | A | | 6/1998 | Kleinhenz .................... 438/155 |
| 5,866,452 | A | | 2/1999 | Willer et al. ................ 438/243 |
| 6,140,199 | A | | 10/2000 | Larsson et al. ............. 438/387 |
| 6,144,055 | A | | 11/2000 | Takenaka .................... 257/301 |
| 6,472,702 | B1 | * | 10/2002 | Shen .......................... 257/301 |
| 2001/0026960 | A1 | * | 10/2001 | Trivedi ....................... 438/128 |
| 2002/0153590 | A1 | | 10/2002 | Kunikiyo .................... 257/532 |

FOREIGN PATENT DOCUMENTS

| DE | 86 03 689.0 | 9/1987 |
| DE | 44 28 195 C1 | 4/1995 |
| DE | 19713052 A1 | 10/1998 |
| EP | 0 283 964 A2 | 9/1988 |
| EP | 0 479 143 A1 | 4/1992 |
| JP | 20011068647 | 3/2001 |
| WO | WO 98/44522 | 10/1998 |
| WO | WO 98/56020 | 12/1998 |

* cited by examiner

*Primary Examiner*—Tu-Tu Ho
(74) *Attorney, Agent, or Firm*—Maginot Moore & Beck

(57) ABSTRACT

A capacitor includes a semiconductor substrate in which a trench is formed through which the substrate is doped. A dielectric layer covers the surface of the trench, wherein furthermore an electrically conductive material is arranged in the trench. A first contact structure for contacting the electrically conductive material in the trench in an electrically conductive manner and a second contact structure for contacting the doped semiconductor substrate in an electrically conductive manner are also formed in the capacitor. The capacitor has low series resistance of the electrodes and may be produced in a simple manner.

24 Claims, 4 Drawing Sheets

CAPACITOR AND METHOD FOR PRODUCING A CAPACITOR

CROSS-REFERENCE TO RELATED APPLICATION

This application is a continuation of co-pending International Application No. PCT/EP 02/12786, filed Nov. 14, 2002, which designated the United States and was not published in English.

BACKGROUND OF THE INVENTION

1. Field of the Invention

The present invention relates to capacitors and in particular to capacitors integrated in a semiconductor substrate.

2. Description of the Related Art

Integrated capacitors are an important ingredient in many semiconductor devices or integrated circuits. For example, integrated capacitors are used in PIN switches or microphone filters. Moreover, integrated capacitors are used in memory cells in conjunction with a transistor in order to store digital information in the memory cells.

In order to obtain high area capacity, i.e. low consumption of chip area per supplied capacity, of the capacitors on the chip, trench capacitors are used, in which the capacitor is housed in a trench of the substrate. By the use of trenches, the depth of the substrate is utilized to provide areas for the formation of the capacitors, whereby high area capacity results.

EP-0 479 143 A1 for example describes a trench capacitor DRAM memory with voltage field insulation. The trench capacitor comprises a plurality of capacitor plates created by a dielectric in the trench formed in a substrate. Both capacitor plates formed of doped semiconductor material are housed in the trench and extend from the trench as thin layers. A further layer disposed nearest to the sidewall of the trench functions as a field-shielding layer. A plurality of sacrificial layers are used and formed over the structure. The other plate of the trench capacitor is also connected to a source/drain area of a transistor via a connection layer.

The above-described, known trench capacitor comprises capacitor plates formed as thin layers, because both the first and the second capacitor plates are in the trench. This is disadvantageous in that very high dopings are required each for achieving low series resistances for the capacitor plates formed as thin semiconductor layers. Furthermore, the applying of layers is connected to high expenditure. In addition to the capacitor dielectric, an electric insulation is applied at the sidewalls of the trench.

SUMMARY OF THE INVENTION

It is the object of the present invention to provide a simple and inexpensive capacitor.

In accordance with a first aspect, the present invention provides a capacitor, having: a doped semiconductor substrate; a trench in the semiconductor substrate; a doping area created by doping via the trench; a dummy trench in the semiconductor substrate; a further doping area created by doping via the dummy trench; a dielectric layer covering a surface of the trench and a surface of the dummy trench; an electrically conductive material in the trench; a first contact structure for contacting the electrically conductive material in the trench in an electrically conductive manner; and a second contact structure for contacting the doping area created by doping via the dummy trench proximate to the dummy trench in an electrically conductive manner.

In accordance with a second aspect, the present invention provides a method for producing a capacitor, with the steps of: providing a semiconductor substrate; creating a trench in the substrate; creating a dummy trench in the semiconductor substrate; doping the semiconductor substrate via the trench, whereby a doping area is created; doping the substrate via the dummy trench, whereby a further doping area is created; creating a dielectric layer on a surface of the trench; creating a dielectric layer on a surface of the dummy trench; introducing filling material into the trench, wherein the filling material is already electrically conductive before its introduction or is made electrically conductive after its introduction; introducing filling material into the dummy trench, wherein the filling material is already electrically conductive before its introduction or is made electrically conductive after its introduction, wherein the electrically conductive material is disposed on the dielectric layer; creating a first contact structure for contacting the electrically conductive material in an electrically conductive manner and a second contact structure for contacting the doping area created by doping via the dummy trench in an electrically conductive manner proximate to the dummy trench.

The present invention is based on the finding that a capacitor with low area consumption and low series resistance is obtained in a semiconductor substrate by a trench whose surface is covered with a dielectric layer being provided in the semiconductor substrate, wherein an electrically conductive material also is in the trench, so that a first electrode of the capacitor is formed by electrically conductive material and is contacted in an electrically conductive manner via a first contact structure, and a second electrode of the capacitor is formed by the semiconductor substrate and contacted in an electrically conductive manner by means of a second contact structure. The semiconductor substrate is a doped output substrate with low-ohmic resistance or preferably an undoped semiconductor substrate having been doped by the trenches.

It is an advantage of the present invention that only one layer, i.e. the dielectric layer, has to be applied in the trench. In particular, by using the semiconductor substrate as electrode, an insulating layer in addition to the dielectric layer is not required for insulating the trench, according to the invention. This leads to a simple production process.

Furthermore, the inventive capacitor comprises low consumption of chip area per supplied capacity by the arranging of the capacitor in a trench.

A further advantage of the invention is low series resistance of the capacitor, because the doped semiconductor substrate is used as a capacitor electrode and a trench filling used as other capacitor electrode may be formed in a broad manner, because only the trench filling and the dielectric layer are arranged in the trench.

Furthermore, there is the possibility in the inventive capacitor that both electrode contacts extend on one side of the substrate. Thereby, costly back-side contacting is avoided.

A further advantage is the possibility to use a highly ohmic substrate that may be doped in a locally restricted manner by the trench, wherein the creating of an insulation to adjacent circuit parts arranged on the substrate is not necessary by the use of a highly ohmic substrate. Furthermore, ohmic losses by electromagnetic coupling are thereby minimized.

In addition to the trench provided for supplying a capacity, a preferred embodiment of the present invention comprises at least one dummy trench in whose proximity the second contact structure for contacting the doped semiconductor substrate in an electrically conductive manner is arranged. Preferably, the "capacitor trench" and the additional dummy trench are used to dope an undoped semiconductor substrate in a production step.

By the doping of the semiconductor substrate by means of at least one dummy trench, which is also filled with electrically conductive material like the capacitor trench, the doping of the semiconductor substrate in the proximity of the trench is especially good. By providing the capacitor trench in the proximity of the dummy trench, it is ensured that an especially low-ohmic area of the semiconductor substrate may be achieved, whereby low series resistance of the capacitor results.

In a first preferred embodiment, the first and second contact structures are formed as conductive plugs extending on the same side of the substrate, wherein they are connected to first and second conductor structures, respectively, formed as fingers and inter-digitally arranged in a layer. This has the advantage that no back-side contact is required.

In a further preferred embodiment, the first contact structure is connected to a first conductor structure arranged in a first plane. In this embodiment, the second contact structure is also connected to a second conductor structure via an inter-conductor structure, wherein the inter-conductor structure is arranged in the plane of the first conductor structure and is between the second conductor structure and the substrate. This offers the advantage that back-side contacting is not required, the capacitor also being simple to integrate in known circuit designs when designing a circuit construction.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
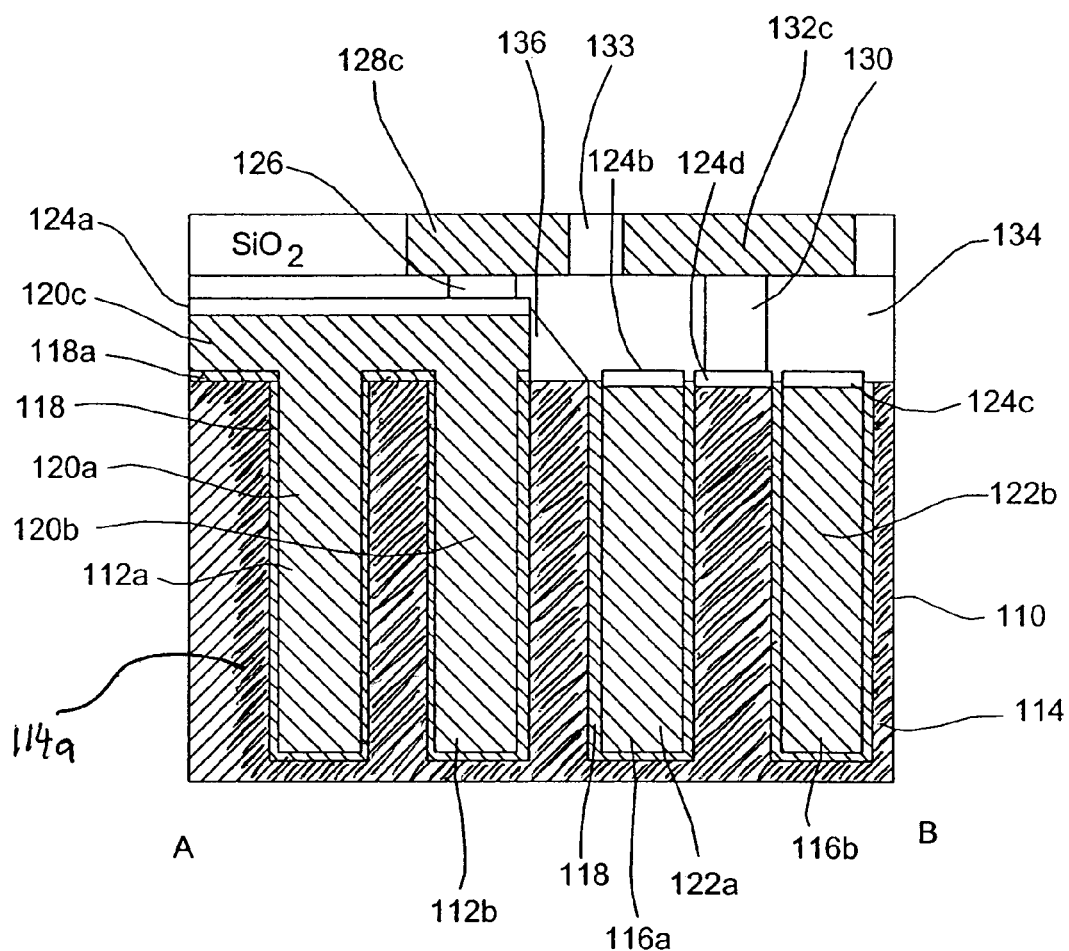
FIG. 1 is a cross-sectional illustration of a first preferred embodiment along a sectional area A–B.

As a first preferred embodiment, FIG. 1 shows a lateral capacitor 110 comprising two trenches 112a and 112b in a substrate 114. The figure illustrates a cutout, with the substrate extending further across the cutout shown in FIG. 1 in a horizontal direction, as explained in greater detail in FIG. 2.

Furthermore, two dummy trenches 116a and 116b are formed in the substrate 114. On the surface of the trenches 112a, 112b and 116a, 116b a dielectric layer 118 is formed.

Furthermore, a dielectric layer 118a extends between the trenches 112a and 112b on a surface of the substrate 114. The substrate 114 preferably comprises a single-crystal semiconductor material highly doped in a doping area 114a via the trenches 112a, 112b, 116a, 116b to a dopant concentration of greater than $10^{18}$ cm$^{-3}$ preferably greater than $10^{20}$ cm$^{-3}$, to obtain high electric conductivity in an area of the trenches. Preferably, with a silicon substrate, $SiO_2$, silicon nitride, or ONO (Oxide-Nitride-Oxide stack) is suited as a dielectric layer, because it is simple to create and comprises good adhesion on silicon. In their interior the trenches 112a and 112b comprise a filling material 120a and 120b, one layer 120c of the same filling material extending beyond the surface of the substrate 114, so that the two filling material areas 120a and 120b are conductively connected to each other via the layer 120c. Likewise, in the trenches 116a and 116b filling material layers 122a and 122b of the same filling material are formed. The filling material preferably consists of poly-crystalline silicon, because it has high electric conductivity and good adhesion on a dielectric layer of $SiO_2$ and is also easy to apply with the known silicon technology, wherein, however, every other electrically conductive material may be used as filling material.

Preferably, the trenches 112a, 112b, 116a, 116b are formed in a cylindrical shape, because this is easy to achieve with known etching methods, wherein they may comprise other shapes in other embodiments. Preferably, the trenches 112a, 112b, 116a, 116b are arranged in a regular pattern, as explained in greater detail with reference to FIG. 2.

On the filling material layer 120c a layer 124a of metal silicide is formed by a self-aligned silicide process. Likewise, layers 124b and 124c of metal silicide are formed on the surface of the substrate 114 on the filling material areas 112a and 112b of the dummy trenches 116a and 116b.

Furthermore, a layer of metal silicide 124d is formed on the surface of the substrate between the layers 124b and 124c. The layer 124a of metal silicide serves for supplying a good electric contact for the filling material layer 120c connected to the filling material areas 120a and 120b forming a first electrode of the capacitor in an electrically conductive manner. To this end, the silicide layer 124a is connected to a conductor structure 128c in an electrically conductive manner via a conductive plug 126 disposed above the silicide layer 124.

Furthermore, the silicide layer 124d serves for supplying a good electric contact for the semiconductor substrate serving as second electrode, the silicide layer 124d being connected to a second conductor structure 132c via a plug 130. The first conductor structure 128c and the second conductor structure 132c are arranged in a plane, wherein they are electrically insulated from each other by insulating areas 133 of $SiO_2$. Furthermore, the plugs 126 and 130 preferably are cylindrical and formed of tungsten and are in a layer 134 of oxide material formed between the plane of the first 128c and second 132c conductor structures and the layer 124 at the surface of the substrate 114, respectively. Thereby, the layer 124 has a step shape due to the raised location of the layer 124a.

Furthermore, at the step formed by the filling material layers 120c and the layer 124a a spacer 136 is formed, which is preferably formed of TEOS material (TEOS=Tetra-Ethyl-Ortho-Silicate). The spacer 136 serves to electrically insulate the layer 124a from the substrate 114 in the critical area of the formed step and to prevent an electric breakdown. Preferably, the conductor structures 128 and 132 in this embodiment are formed in a finger-shaped manner and arranged inter-digitally to obtain low series resistance, as it is subsequently explained in greater detail with reference to FIG. 2.

With reference to FIG. 1, now the mode of operation of the present capacitor is to be explained in greater detail. The semiconductor substrate connected to the conductor structures via the plug 130 has a high doping, the doping being created in a production step via the trenches 112 and 116, as subsequently explained in greater detail. Consequently, the semiconductor substrate serves as a first electrode of the inventive capacitor, wherein due to the fact that the semiconductor substrate is highly doped via the trenches a low series resistance is achieved. Furthermore, further minimizing of the series resistance and a low inductivity results by the plug 130 with a short length being directly connected to the conductor structure 132.

The conductive filling material areas 120a and 120b electrically insulated from the semiconductor substrate by the dielectric layer 118 function as counter-electrodes to the semiconductor substrate. The such-formed counter-electrode also has low series resistance and low inductivity, because it is connected to the conductor structure 128 via a short path. Since the trenches 112a and 112b only include the filling material areas 112a and 112b, respectively, and the dielectric layer 118 typically formed thinly, the filling material areas 112a or 112b may extend across the entire width of the trench, which results in a great conductor cross-section and also contributes to low electric resistance of the filling material areas 112a or 112b together with the fact that the filling material comprises a material with high conductivity, such as polysilicon.

By positioning the plug 130 close to the trenches 112a, 112b functioning as capacitor trenches, an electric path in the substrate from the plug 130 to the trenches 112a, 112b is decreased, with this beneficially affecting the electric resistance.

Accordingly, the capacitor comprises low electric series resistances of the electrodes so that it is suited for employment in integrated filter circuits.

At this point it is to be mentioned that the dummy trenches 116a and 116b in the embodiment shown are only utilized to dope the substrate in a doping step and have no function for supplying a capacity. This enables that a highly ohmic substrate may be used, which is selectively doped via the trenches in a doping step, whereby the creating of insulations is not required, as it is necessary for insulating adjacent circuit parts in a doped output substrate.

Figure 2:
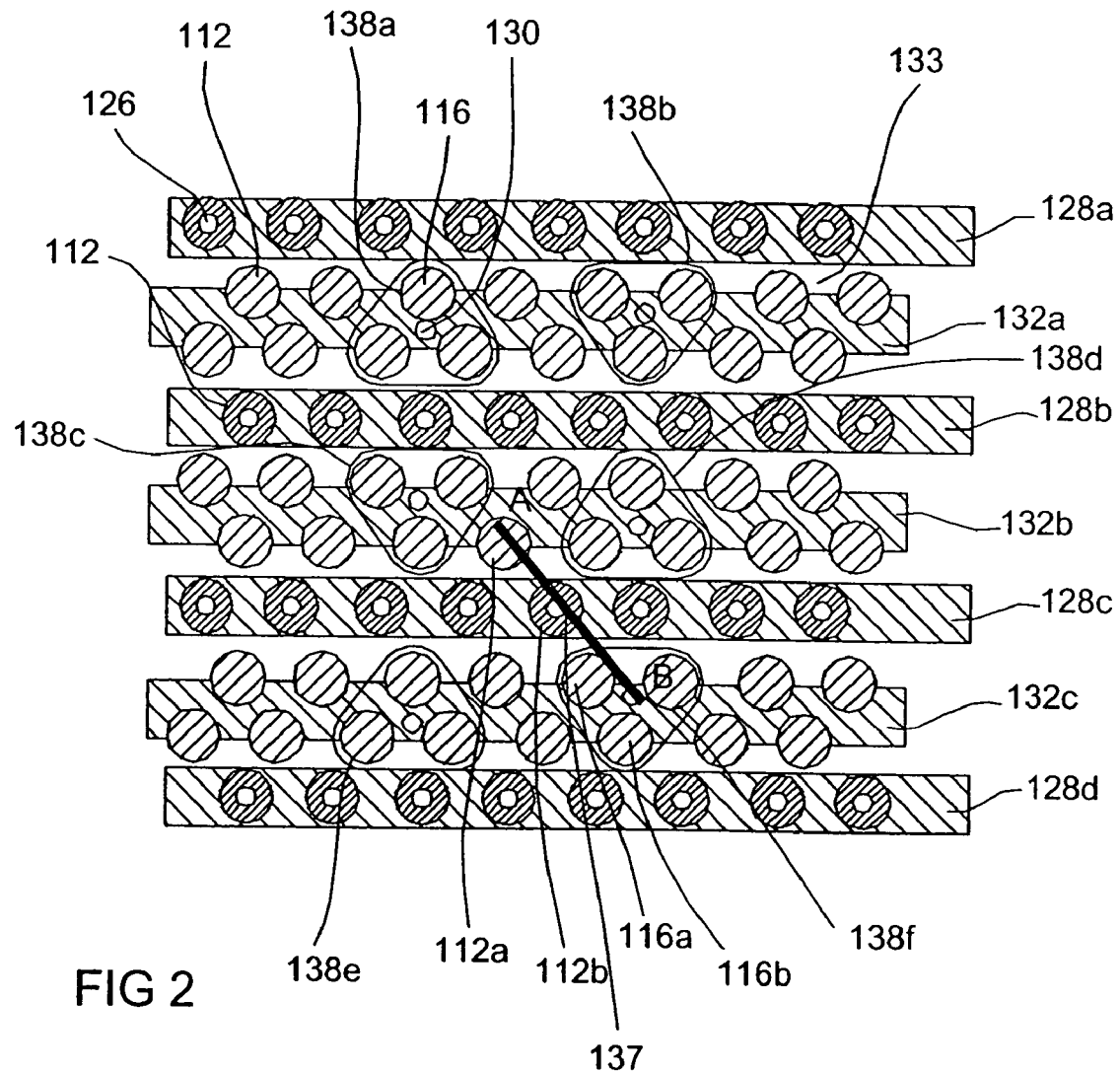
FIG. 2 is a top view of the embodiment of FIG. 1.

FIG. 2 shows a top view of the embodiment of FIG. 1, wherein the sectional plane A–B corresponding to the illustration of FIG. 1 is illustrated by a line with the reference numeral 137. FIG. 2 shows a top view taken from the plane in which the conductor structures are arranged. In FIG. 2 four conductor structures 128a, 128b, 128c, and 128d are shown that are formed as fingers and arranged inter-digitally with conductor structures 132a, 132b and 132c, wherein they are insulated from each other by insulating areas 133. Furthermore, the trenches 112 and 116 that are each illustrated circularly are arranged in a regular pattern. The trenches 116 formed as dummy trenches are each disposed in arrangements 138a, 138, b, 138c, 138d, 138e and 138f, each arrangement including three dummy trenches 116. In the arrangements 138a–f, the trenches 116 are each arranged in approximately the form of an equilateral triangle, each with a plug 130 being in the center thereof. The plug 130 provides the electric connection of the conductor structures 132a, 132b, and 132c to the substrate 140, as it has been explained with reference to FIG. 1 above. Preferably, the arrangements 138a–f are uniformly distributed across the surface, so that the conductor paths in the substrate from the respective plugs 130 to the "capacitor trenches" 112 are kept small. This is advantageous for the achievement of a low electric resistance, because the substrate, although it is highly doped and thus has good conductivity, comprises the lower conductivity in comparison with the metal traces and thus decisively contributes to the electric resistance.

For the achievement of low series resistances, also other arrangements and patterns of trenches or conductor structures may be used. The arrangement shown in FIG. 2 offers the advantage of simple designing and producing of the capacitor.

Furthermore, those trenches 112 arranged below the conductor structures 128a, 128b, 128c, and 128d comprise the plugs 126 to connect the conductor structures 128a–128d to the filling material layers of the trenches 112 in an electrically conductive manner, such as the filling material layer 120c according to FIG. 1. At this point it is to be noted that although trenches 112 are arranged above the conductor structures 132a–132c they do not have an electric connection to the conductor structures 132a–132c. These trenches 112 are rather connected to the plugs 126 and thus to the conductor structures 128a–128d via filling material layers, such as the filling material layer 120c according to FIG. 1.

Accordingly, the conductor structures 132a, 132b and 132c represent conductor structures having an electric connection to the substrate via plugs 132. The conductor structures 128a–128d also represent the leads electrically connected to the conductive filling material areas of the trenches 112.

Figure 3:
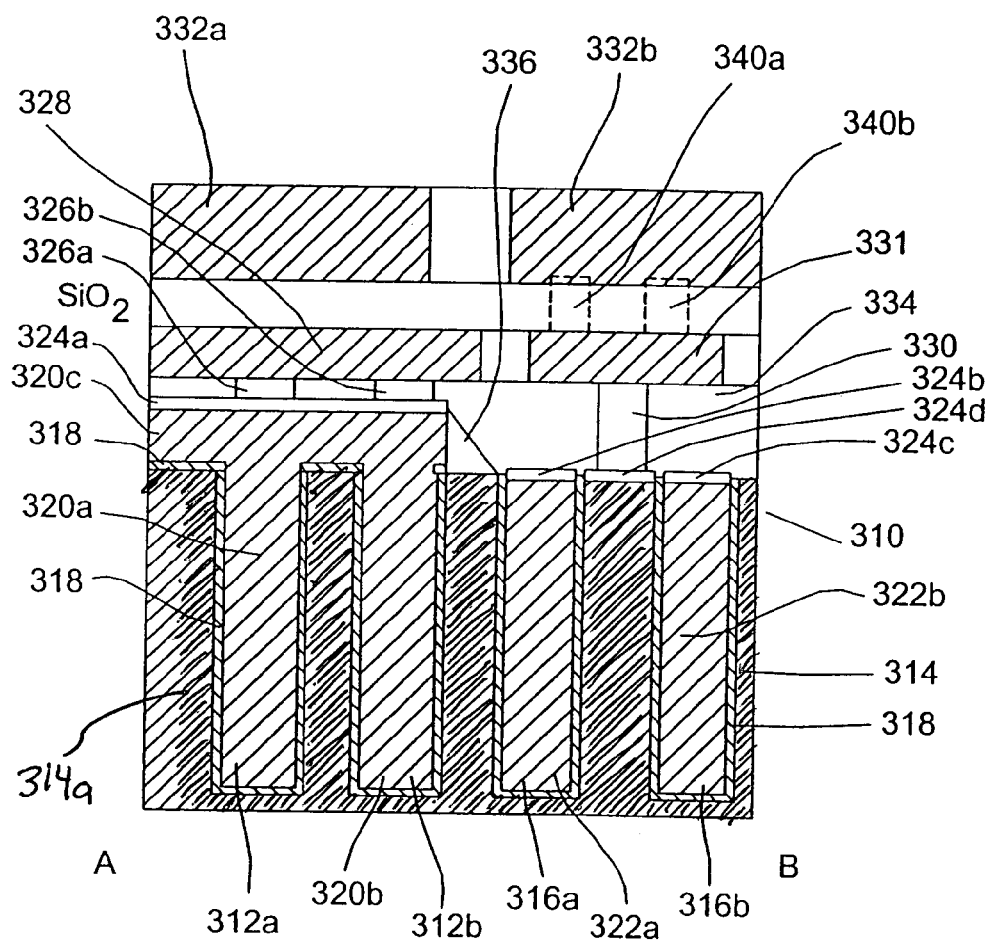
FIG. 3 is a sectional illustration of a second preferred embodiment along a sectional area A–B.

With reference to FIG. 3, now a second preferred embodiment of the present invention is explained. Corresponding to the embodiment according to FIG. 1, the capacitor 310 comprises two trenches 312a and 312b as well as two dummy trenches 316a and 316b and a doping are 314a. Furthermore, filling material areas 320a and 320b, and 322a and 322b, respectively, are each electrically insulated from a semiconductor substrate 314 via a dielectric layer 318. The filling material areas 320a and 320b are connected to each other electrically via a filling material layer 320c. Corresponding to the embodiment according to FIG. 1, furthermore a layer 324a of metal silicide is formed on the filling material layer 320c. Furthermore, layers 324b and 324c of metal silicide are formed on the filling material areas 322a and 322b. A further layer 324d of metal silicide is formed on the surface of the substrate 314 between the layers 324b and 324c.

In contrast to the embodiment according to FIG. 1, this embodiment comprises a design with a two-sheet metallization. The filling material layer 320c is connected to a conductor structure 328 via plugs 326a and 326b. Furthermore, the doped semiconductor substrate 314 is connected to an inter-conductor structure 331 via the silicide layer 324d and a plug 330. The inter-conductor structure 331 is arranged in the same plane as the conductor structure 328 and electrically insulated therefrom via an area of $SiO_2$. On the conductor structure 328 and the inter-conductor structure 331, a layer of insulating material, such as $SiO_2$, is formed that electrically insulates a conductor structure 332 arranged above from the conductor structure 328. According to FIG. 3, the conductor structure 332 comprises a first area 332a and a second area 332b that are electrically insulated from each other by an insulation area formed of, for example, $SiO_2$. The conductor structure area 332b is connected to the inter-conductor structure 331 in an electrically conductive manner via through holes 340a and 340b.

Furthermore, the embodiment shown, corresponding to the embodiment according to FIG. 1, comprises between the plane of the conductor structures 328, 331 and the substrate or the filling material layer 320c a layer 334 with a step. The layer 334 is preferably formed of an oxide material. Corresponding to the embodiment according to FIG. 1, the embodiment also comprises a spacer 336 arranged at a step formed by the filling material layer 320c. Corresponding to the embodiment of FIG. 1, a first electrode is formed by the semiconductor substrate, while a second electrode is formed by the filling material areas 322a and 322b. According to the embodiment of FIG. 1, the dummy trenches 316a and 316b are only used to dope the highly ohmic substrate in a doping step and have no function for providing a capacity.

Figure 4:
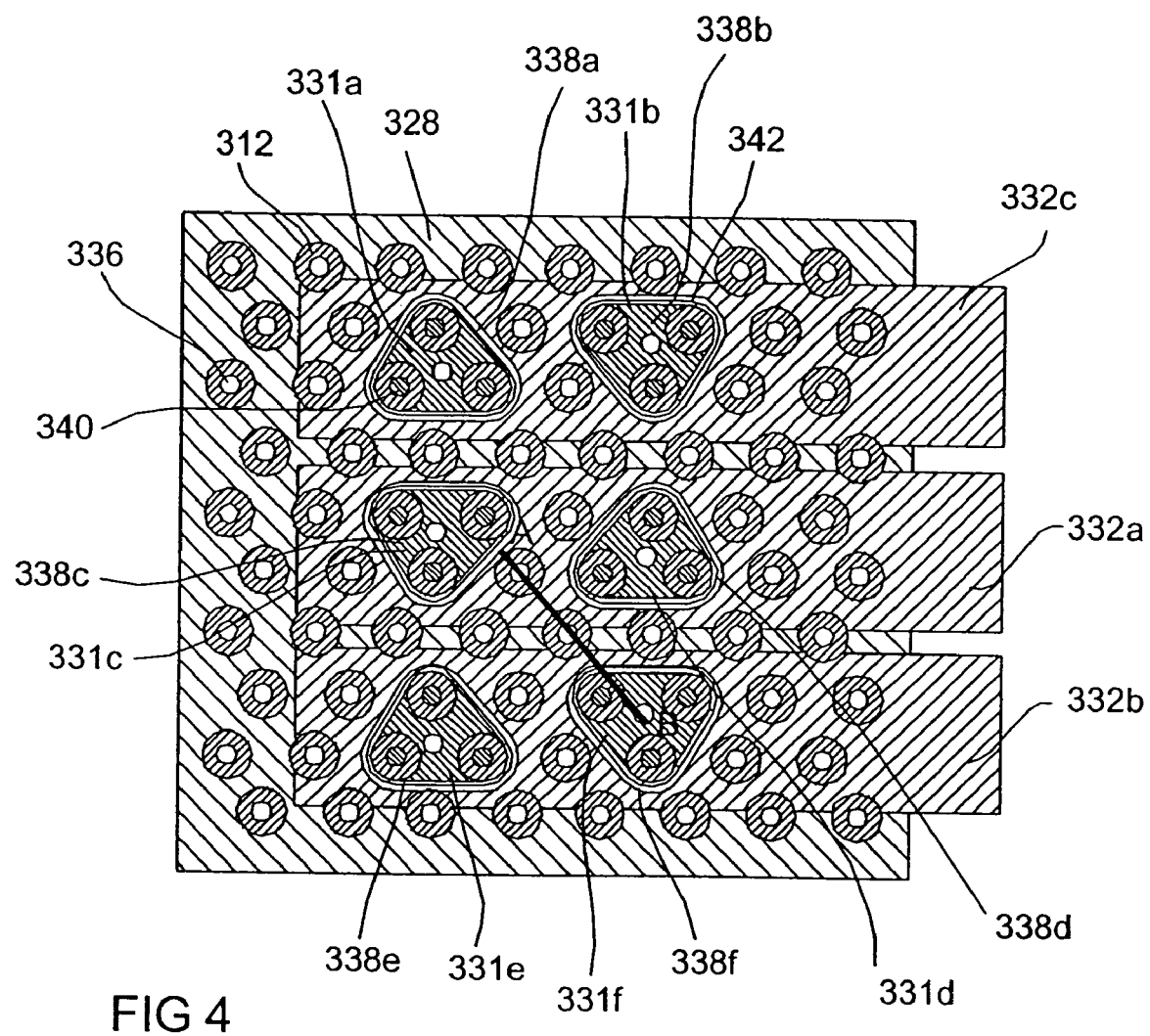
FIG. 4 is a top view of the embodiment of FIG. 3.

With reference to FIG. 4, now a top view of the embodiment according to FIG. 3 is explained. The upper layer including the conductor structure is drawn transparently to be able to illustrate the underlying structures. The section area along which the side view of FIG. 3 is taken is illustrated by a line with the reference numeral 337 from the point A to the point B.

FIG. 4 shows three conductor structures 332a, 332b, and 332c arranged in the uppermost metallization plane. Corresponding to the embodiment of FIG. 2, the trenches 312 and 316 are arranged in a regular pattern. Each of the dummy trenches 316 is associated with a through hole 340. The inter-conductor structure 331 comprises six inter-conductor structure areas insulated from each other and arranged in an island-like manner, wherein the through holes 340 connect the conductor structures 332a–c to one area of the inter-conductor structure 331 each. Three of the dummy trenches 316 are each combined to arrangements 338a–338f, wherein each of the arrangements 338a–f is associated with an inter-conductor structure 331 electrically insulated from the conductor structure 328 in the plane of the first metallization. The three dummy trenches 316 of an arrangement are arranged approximately in the form of an equilateral triangle, wherein inter-conductor structure areas 331a–f that are each associated with them comprise a triangle-like shape. Each of the inter-conductor structure areas 331a–f is electrically connected to the semiconductor substrate via a conductive plug arranged in the center of the three dummy trenches of an arrangement. Accordingly, each of the conductor structures 332a–332c is connected to the semiconductor substrate functioning as an electrode of the capacitor via the inter-conductor structure areas 331a–f in the first metallization plane. The conductor structures of the first and second metallization planes are preferably formed of copper.

Furthermore, in this embodiment each filling material area of a trench 312 is connected to the conductor structure 328 in the first metallization plane via a conductive plug 326. As can be seen in FIG. 4, in the first metallization plane the conductor structure 328 is electrically insulated from the inter-conductor structure area formed as a triangle in an island-like manner via insulation areas 242. The arrangement of the conductor structures 328 and the conductor structure 332 on different metallization planes in this embodiment enables that the conductor structures 328 and 332, respectively, may each be formed in a large-area manner, whereby an electric series resistance is decreased. At this point it is to be noted that the illustration in FIG. 4 is kept transparent so that both the structures of the trenches 312, 315 at the planes of the first metallization plane and the second metallization plane can be seen.

The shown regular grouping of the arrangements 338a–f so that they are surrounded by trenches 312 has the advantage that the connection paths in the substrate to a respective capacitor trench are kept short so that low series resistance is achieved. Furthermore, arranging the trenches 316 to trench groups has the advantage that in a doping step in the area thereof high doping may be achieved so that thereby the series resistance is also decreased.

Since correspondingly long current paths through the substrate that are fixed by the distance of the plugs 330 to the capacitor trenches 312 result when arranging connection paths on the same side of the substrate, high doping of the substrate is required for achieving low resistance. This is achieved by the doping via the trenches.

Although six arrangements each including 3 dummy trenches are shown in the embodiments shown, the number of the arrangements 338a–f and the amount of dummy trenches in an arrangement 338a–f are not limited to a certain number. In other embodiments more or less than six arrangements 338a–f with a certain number of dummy trenches may rather be provided. Preferably, the arrangements 338a–f are arranged in a regular pattern, which facilitates designing and creating them, wherein in other embodiments also non-regularly arranged arrangements are provided, however. Likewise, the trenches 112 and 116 may also be arranged in a non-regular form.

Furthermore, in an alternative embodiment, instead of the grouping of dummy trenches 316 to arrangements, the trenches 312 may be grouped in island-like arrangements adjacent to each other.

Again referring to FIG. 1, a preferred method for producing a capacitor is now explained in greater detail in the following.

In a first production step, the trenches 112a, 112b, 116a, and 116b are created in an etching step according to known techniques in the undoped semiconductor substrate, which is preferably formed of single-crystal silicon. Then phosphorus doping of the semiconductor substrate 114 is performed through the surface of the trenches 112a, 112b, 116a and 116b in the substrate. To this end, in a first step using $PCl_3$ a phosphorus-doped layer is created on the surface of the trenches 112a, 112b, 116a, and 116b. In a successive step, the chip is heated to cause a diffusion of phosphorus as doping material in the substrate. In a next step, the phosphorus-doped layer on the surface of the trenches 112a, 112b, 116a, and 116b is removed by etching with HF. The removing of the phosphorus-doped layer is performed because it has bad dielectric properties in comparison with other known dielectrics. A typical doping that is achieved in this doping step includes an area greater than $10^{18}$ cm$^{-3}$ and preferably greater than $10^{20}$ cm$^{-3}$. Using the trenches for doping ensures that a high doping may be achieved to minimize the electrode series resistance formed by the substrate of the capacitor to be produced. Furthermore, the doping of a non-doped semiconductor substrate has the advantage that additional production steps are not required, as they would be required in a doped output semiconductor substrate for achieving an insulation of adjacent circuit parts.

In a next step, the dielectric layer 118 is deposited on the surface of the formed trenches 112a, 112b, 116a, and 116b as well as in an area between the trenches 112a and 112b on the surface of the substrate. Then the filling material is introduced into the trenches 112a, 112b, 116a, and 116b by deposition, the deposited filling material also being deposited as a layer on the surface of the substrate 114. The filling material may be a material that is already conductive in the step of depositing, or maybe a non-conductive material that is made conductive only after depositing. Preferably, a filling material layer of polysilicon is used to obtain a high electric conductivity. Other filling materials, such as tungsten, may also be used.

The filling material layer on the surface of the substrate and the dielectric layer on the surface of the substrate are then partially, i.e. in the areas of the dummy trenches 116a and 116b, etched to the substrate using known photolithography and etching methods, so that the layer of the filling material and the dielectric layer is removed in the area between the dummy trench 116a and the adjacent trench 122b.

The etching of the filling material and the dielectric to the doped substrate in the area of the dummy trenches enables that the electrode contacts may be drawn to the same side as the contacting of the filling material of the capacitor trench 112 via the semiconductor substrate in a low-ohmic manner.

In a successive step, a silicide-forming metal is deposited and the silicide reaction of same is performed with the underlying silicon for creating a good contact layer, so that thereby a metal silicide is formed. Preferably, this step includes the forming of $TiSi_2$.

As the next step the spacer 136 is created by a deposition of TEOS material (TEOS=Tetra-Ethyl-Ortho-Silicate) and then anisotropically etching, so that at the step formed at the layer 120c the spacer 136 is formed in the shape of a triangle.

Then an inter-oxide layer (ZOX layer) is deposited and subjected to planarization in a successive step, so that the surface of the inter-oxide layer has a plane structure and is parallel to the surface of the substrate.

In a successive step, the contact holes 126 and 130 forming the connection structure are etched into the ZOX layer, the etching being performed by means of known methods such that a selective etch stop takes place on the silicide layer. Then the contact holes 126 and 130 are filled with an electrically conductive material, preferably including tungsten.

In a next step, chemical-mechanical polishing is performed to obtain a planarization of step discontinuities for the successive metallization steps. In a following metallization step, the conductor structures 128c or 132c are applied according to known methods.

It is to be noted that in this preferred method the introduced dummy trenches 116 only serve to provide a surface for diffusing the doping material in, wherein the materials applied in them, i.e. the filling material and the dielectric layer, do not have a usage function of a capacitor element in the dummy trenches.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A capacitor, comprising:
   a high-ohmic semiconductor substrate;
   a first trench in the semiconductor substrate;
   a doping area disposed adjacent to the first trench, the doping area containing doping material introduced via the first trench;
   a dummy trench in the semiconductor substrate, the dummy trench having no function for supplying capacitance for the capacitor;
   a further doping area disposed adjacent to the dummy trench, the further doping area containing doping material introduced via the dummy trench;
   a dielectric layer disposed over a surface of the first trench and a surface of the dummy trench;
   an electrically conductive material in the first trench;
   a first contact structure for contacting the electrically conductive material in the first trench in an electrically conductive manner; and
   a second contact structure for contacting the further doping area proximate to the dummy trench in an electrically conductive manner.

2. The capacitor of claim 1, further comprising at least one additional trench.

3. The capacitor of claim 1, further comprising a third trench and wherein the second contact structure contacts the semiconductor substrate between the dummy trench and the third trench in an electrically conductive manner.

4. The capacitor of claim 1, further comprising an electrically insulating spacer disposed on the surface of the semiconductor substrate for the increase of voltage strength.

5. The capacitor of claim 1, wherein the first and the second contact structures extend on the same side of the semiconductor substrate.

6. The capacitor of claim 1, wherein the first contact structure comprises conductive plugs formed in an insulation layer, the insulation layer extending across the first trench and the dummy trench.

7. The capacitor of claim 1, wherein the second contact structure comprises conductive plugs formed in an insulation layer, the insulation layer extending across the first trench and the dummy trench.

8. The capacitor of claim 1, wherein the first contact structure is connected to a first conductor structure in an electrically conductive manner, and the second contact structure is connected to a second conductor structure in an electrically conductive manner.

9. The capacitor of claim 8, wherein the first and the second conductor structures are arranged in a plane parallel to a surface of the semiconductor substrate.

10. The capacitor of claim 9, wherein the first and the second conductor structures comprise an inter-digitally arranged finger structure.

11. The capacitor of claim 8, wherein the first conductor structure is arranged in a first plane parallel to a surface of the semiconductor substrate, and the second conductor structure is arranged in a second plane parallel to the surface of the semiconductor substrate.

12. The capacitor of claim 11, wherein a conductive inter-conductor structure electrically insulated from the first conductor structure is formed in the first plane, the second conductor structure being arranged such that the first plane is arranged between the second plane and the semiconductor substrate, and the second conductor structure further being connected to the inter-conductor structure via conductive through holes in an electrically conductive manner.

13. The capacitor of claim 1, further comprising a plurality of first trenches and a plurality of dummy trenches, wherein the first trenches and the dummy trenches are arranged in a regular pattern, and wherein dummy trenches are combined to form arrangements.

14. The capacitor of claim 12, wherein the inter-conductor structure includes several inter-conductor structure areas, wherein in addition to the first trench several further first trenches and in addition to the dummy trench several further dummy trenches are formed, and wherein dummy trenches are combined to form arrangements, each of the several inter-conductor structure areas being associated with one of the arrangements.

15. A method for producing a capacitor, comprising:
   providing a high-ohmic semiconductor substrate;
   creating a first trench in the substrate;
   creating a dummy trench in the semiconductor substrate;
   doping the semiconductor substrate via the first trench, whereby a doping area is created;

doping the substrate via the dummy trench, whereby a further doping area is created;

creating a dielectric layer on a surface of the first trench;

creating a dielectric layer on a surface of the dummy trench;

introducing filling material into the first trench, and making the filling material electrically conductive if the filling material is not electrically conductive;

introducing filling material into the dummy trench, and making the filling material electrically conductive if the filling material is not electrically conductive; and creating a first contact structure for contacting the electrically conductive material in the first trench in an electrically conductive manner and a second contact structure for contacting the doping area created by doping via the dummy trench in an electrically conductive manner proximate to the dummy trench.

16. The method of 15, wherein the step of doping the semiconductor substrate via the first trench includes a diffusion of a dopant.

17. The method of claim 16, wherein the step of doping the semiconductor substrate further includes:
creating a phosphorus-doped silicate layer in the first trench; and
heating to diffuse phosphorus as dopant from the phosphorus-doped silicate layer into the semiconductor substrate.

18. The method of claim 15, further including the step of creating an electrically insulating spacer for the increase of a voltage strength on the surface of the semiconductor substrate.

19. The method of claim 18, wherein the step of creating an electrically insulating spacer includes anisotropically etching the electrically insulating spacer.

20. The method of claim 15, wherein the step of creating a first contact structure for contacting the electrically conductive material in an electrically conductive manner and a second contact structure for contacting the semiconductor substrate in an electrically conductive manner includes creating a silicide layer on the filling material and on a surface of the semiconductor substrate.

21. The method of claim 20, wherein the step of creating a first contact structure includes the step of applying an inter-oxide layer on a surface of the semiconductor substrate and then etching the inter-oxide layer, so that the inter-oxide layer is partly removed, wherein the silicide layer functions as a selective etch stop in the etching.

22. The method of claim 15, wherein the semiconductor substrate is a highly ohmic semiconductor substrate.

23. A capacitor, comprising:
a high-ohmic semiconductor substrate;
a first trench in the semiconductor substrate;
a doping area disposed adjacent to the first trench, the doping area containing doping material introduced via the first trench;
a dummy trench in the semiconductor substrate, the dummy trench having no function for supplying a capacity for the capacitor;
a further doping area disposed adjacent to the dummy trench, the further doping area containing doping material introduced via the dummy trench;
a dielectric layer disposed over a surface of the first trench and a surface of the dummy trench;
an electrically conductive material in the first trench;
an electrically conductive filling material in the dummy trench;
a first contact structure for contacting the electrically conductive material in the first trench in an electrically conductive manner;
a second contact structure for contacting the further doping area proximate to the dummy trench in an electrically conductive manner; and
an insulating layer for electrically insulating the electrically conductive filling material in the dummy trench from the first and second contact structure.

24. A method for producing a capacitor, comprising:
providing a high-ohmic semiconductor substrate;
creating a first trench in the substrate;
creating a dummy trench in the semiconductor substrate;
doping the semiconductor substrate via the first trench, whereby a doping area is created;
doping the substrate via the dummy trench, whereby a further doping area is created;
creating a dielectric layer on a surface of the first trench;
creating a dielectric layer on a surface of the dummy trench;
introducing filling material into the first trench, and making the filling material electrically conductive if the filling material is not electrically conductive;
introducing filling material into the dummy trench, and making the filling material electrically conductive if the filling material is not electrically conductive;
creating a first contact structure for contacting the electrically conductive material in the first trench in an electrically conductive manner and a second contact structure for contacting the doping area created by doping via the dummy trench in an electrically conductive manner proximate to the dummy trench; and
creating an insulating layer above the dummy trench, the insulating layer electrically insulating the filling material in the dummy trench from the first and second contact structure.

* * * * *